(12) United States Patent
Coban et al.

(10) Patent No.: US 9,800,281 B2
(45) Date of Patent: Oct. 24, 2017

(54) SIGNAL PROCESSOR SUITABLE FOR LOW INTERMEDIATE FREQUENCY (LIF) OR ZERO INTERMEDIATE FREQUENCY (ZIF) OPERATION

(71) Applicant: Silicon Laboratories Inc., Austin, TX (US)

(72) Inventors: Abdulkerim L. Coban, Austin, TX (US); Alessandro Piovaccari, Austin, TX (US); Ramin K. Poorfard, Austin, TX (US); James T. Kao, Los Gatos, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/470,989

(22) Filed: Mar. 28, 2017

(65) Prior Publication Data
US 2017/0201282 A1 Jul. 13, 2017

Related U.S. Application Data

(62) Division of application No. 12/571,092, filed on Sep. 30, 2009, now Pat. No. 9,647,623.

(51) Int. Cl.
*H04B 1/06* (2006.01)
*H04B 1/16* (2006.01)
*H03G 3/30* (2006.01)

(52) U.S. Cl.
CPC ............. *H04B 1/16* (2013.01); *H03G 3/3068* (2013.01)

(58) Field of Classification Search
CPC .. H04L 5/0048; H04L 5/0051; H04W 52/241; H04W 72/0473; H04W 52/146; H04W 52/16; H04W 52/325
See application file for complete search history.

(56) References Cited

U.S. PATENT DOCUMENTS

| | | |
|---|---|---|
| 4,656,630 A | 4/1987 | Miyo |
| 5,170,495 A | 12/1992 | McNicol et al. |

(Continued)

FOREIGN PATENT DOCUMENTS

| | | |
|---|---|---|
| CN | 102035560 B | 8/2015 |
| DE | 102010040965 A1 | 7/2011 |

OTHER PUBLICATIONS

P. Antoine, et al., "A direct-conversion receiver for DVB-H," IEEE Int. Solid-State Circuits Conf. (ISSCC), Dig. Tech. Papers, Feb. 2006, pp. 606-607.

(Continued)

*Primary Examiner* — Bobbak Safaipour
(74) *Attorney, Agent, or Firm* — Polansky & Associates, P.L.L.C.; Paul J. Polansky

(57) ABSTRACT

A signal processor for a radio frequency (RF) receiver includes a signal processing path having first and second programmable gain amplifiers and first and second offset correction circuits. The first offset correction circuit receives a first digital offset correction word and corrects a first offset of the first programmable gain amplifier by adding a first value corresponding to the first digital offset correction word to an input of the first programmable gain amplifier. The second offset correction circuit receives a second digital offset correction word and corrects a second offset of the second programmable gain amplifier by adding a first value corresponding to the second digital offset correction word to an input of the second programmable gain amplifier. A controller measures offsets of the first and second programmable gain amplifiers during a calibration, and provides the first and second offset correction words in response to the offsets.

20 Claims, 7 Drawing Sheets

(56) References Cited

U.S. PATENT DOCUMENTS

| | | | |
|---|---|---|---|
| 5,745,531 | A | 4/1998 | Sawahashi et al. |
| 6,134,430 | A | 10/2000 | Younis et al. |
| 6,761,316 | B2 | 7/2004 | Bridgelall et al. |
| 6,895,219 | B2 | 5/2005 | Bridgelall |
| 6,977,976 | B1 | 12/2005 | Birkett et al. |
| 6,993,291 | B2 | 1/2006 | Parssinen et al. |
| 7,142,619 | B2 | 11/2006 | Sommer et al. |
| 7,203,476 | B2 | 4/2007 | Ruelke et al. |
| 7,548,738 | B2 | 6/2009 | Srinivasan et al. |
| 7,580,428 | B1 | 8/2009 | Nassiri-Toussi et al. |
| 7,894,786 | B2 | 2/2011 | Hwang |
| 8,000,756 | B2 | 8/2011 | Beck et al. |
| 8,145,170 | B2 | 3/2012 | Khoini-Poorfard et al. |
| 8,229,381 | B2 | 7/2012 | Ling et al. |
| 8,558,613 | B2 * | 10/2013 | Acosta-Serafini ....... H03G 3/30 330/136 |
| 8,718,127 | B2 * | 5/2014 | Acosta-Serafini H04L 25/03878 327/559 |
| 8,781,427 | B1 * | 7/2014 | Kan ..................... H03G 3/3078 455/234.1 |
| 9,571,036 | B2 * | 2/2017 | Sahlman .................. H03D 7/18 |
| 2003/0040275 | A1 | 2/2003 | Bridgelall |
| 2006/9222115 | | 10/2006 | Dornbusch et al. |
| 2009/0209220 | A1 | 8/2009 | Beck et al. |
| 2011/0076977 | A1 | 3/2011 | Coban et al. |
| 2014/0043088 | A1 * | 2/2014 | Yamaji ..................... G06G 7/14 327/361 |

OTHER PUBLICATIONS

I. Vassiliou, et al., "CMOS Dual-Band Direct-Conversion DVB-H Receiver," IEEE Int. Solid-State Circuits Conf. (ISSCC), Dig. Tech. Papers, Feb. 2006, pp. 606-607.

Young-jin Kim, et al., "A Multi-Band Multi-Mode CMOS Direct-Conversion DVB-H Tuner," IEEE Int. Solid-State Circuits Conf. (ISSCC), Dig. Tech. Papers, Feb. 2006, pp. 608-609.

M. Womac, et al., "Dual-band Single-Ended-Input Direct-Conversion DVB-H Receiver," IEEE Int. Solid-State Circuits Conf. (ISSCC), Dig. Tech. Papers, Feb. 2006, pp. 610-611.

V. Peluso, et al., "A Dual-Channel Direct-Conversion CMOS Receiver for Mobile Multimedia Broadcasting," IEEE Int. Solid-State Circuits Conf. (ISSCC), Dig. Tech. Papers, Feb. 2006, pp. 612-613.

V. Fillâtre, et al., "A SiP Tuner with Integrated LC Tracking Filter for both Cable and Terrestrial TV Reception," IEEE Int. Solid-State Circuits Conf. (ISSCC), Dig. Tech. Papers, Feb. 2007, pp. 208-209.

P. Antoine, et al., "A direct-conversion receiver for DVB-H," IEEE Journal of Solid-State Circuits, vol. 40, No. 12, Dec. 2005.

* cited by examiner

SIGNAL PROCESSOR SUITABLE FOR LOW INTERMEDIATE FREQUENCY (LIF) OR ZERO INTERMEDIATE FREQUENCY (ZIF) OPERATION

This application is a division of U.S. patent application Ser. No. 12/571,092, filed Sep. 30, 2009, invented by the inventors hereof and assigned to the assignee hereof.

FIELD OF THE DISCLOSURE

The present disclosure relates generally to radio frequency (RF) receivers, and more particularly to signal processors for RF receivers.

BACKGROUND

Radio frequency (RF) receivers are used in a wide variety of applications such as television receivers, cellular telephones, pagers, global positioning system (GPS) receivers, cable modems, cordless phones, satellite radio receivers, and the like. One common type of RF receiver is the so-called superheterodyne receiver. A superheterodyne receiver mixes the desired data-carrying signal with the output of tunable oscillator to produce an output at a generally fixed intermediate frequency (IF). The fixed IF signal can then be conveniently filtered and converted down to baseband for further processing. Thus a superheterodyne receiver requires two mixing steps.

Traditionally, certain RF receivers have adopted standard IFs. For example a television receiver translates a selected channel in the band of 48 MHz to 870 MHz to a standard IF of 44 MHz. Within the United States, FM radios typically translate FM audio signals, which are broadcast in 200 KHz channels in the frequency band from 88.1 MHz to 107.9 MHz, to a standard IF of 10.7 MHz. More recently, RF receivers have adopted low intermediate frequency (LIF) and zero intermediate frequency (ZIF) architectures to take advantage of processing capabilities of modern digital signal processors (DSPs).

Moreover high quality RF receivers use automatic gain control (AGC) circuits to adjust the gain or attenuation of various elements in the receiver in order to regulate the power levels. For example, a television signal with low input power can be amplified to increase the signal strength for further processing. In another example, a filtered signal may be too powerful for a following component, and so the filtered signal is attenuated to decrease the power level. Without such AGC circuits, the quality of the received desired signal would be reduced. For instance, the displayed image of a television signal would get dimmer as the power level dropped and eventually would start showing an increasing level of background noise. Conversely, the displayed image would be brighter as the power level rose and eventually would show image artifacts due to the system's non-linearities, like beat frequency waves or images in the background of the desired image.

Terrestrial and cable television transmission environments make AGC difficult due to the presence of blockers. A blocker is an unwanted channel with significant signal energy whose frequency is close to the desired channel frequency and thus is difficult to filter out. Since the blocker is not easily filtered, it can degrade the signal quality of the desired channel. Filtering out the undesirable energy of a blocker is especially difficult when the receiver uses an LIF or ZIF architecture because television transmission systems use many closely spaced channels.

Moreover the strongest blocker will sometimes be adjacent in frequency to the desired channel, and at other times be more remote in frequency. Also the blocker may have a much larger signal strength than the desired channel, and the signal strength can vary over time, for example, when a moving receiver passes into a tunnel or behind a building, or an obstruction, such as an airplane, passes between the transmitter and the receiver. These factors make AGC in LIF or ZIF signal processors especially difficult.

What is needed, then, are new analog baseband processor architectures for applications such as television receivers with AGC suitable for use in the presence of strong blockers and which are also suitable for LIF and ZIF architectures.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
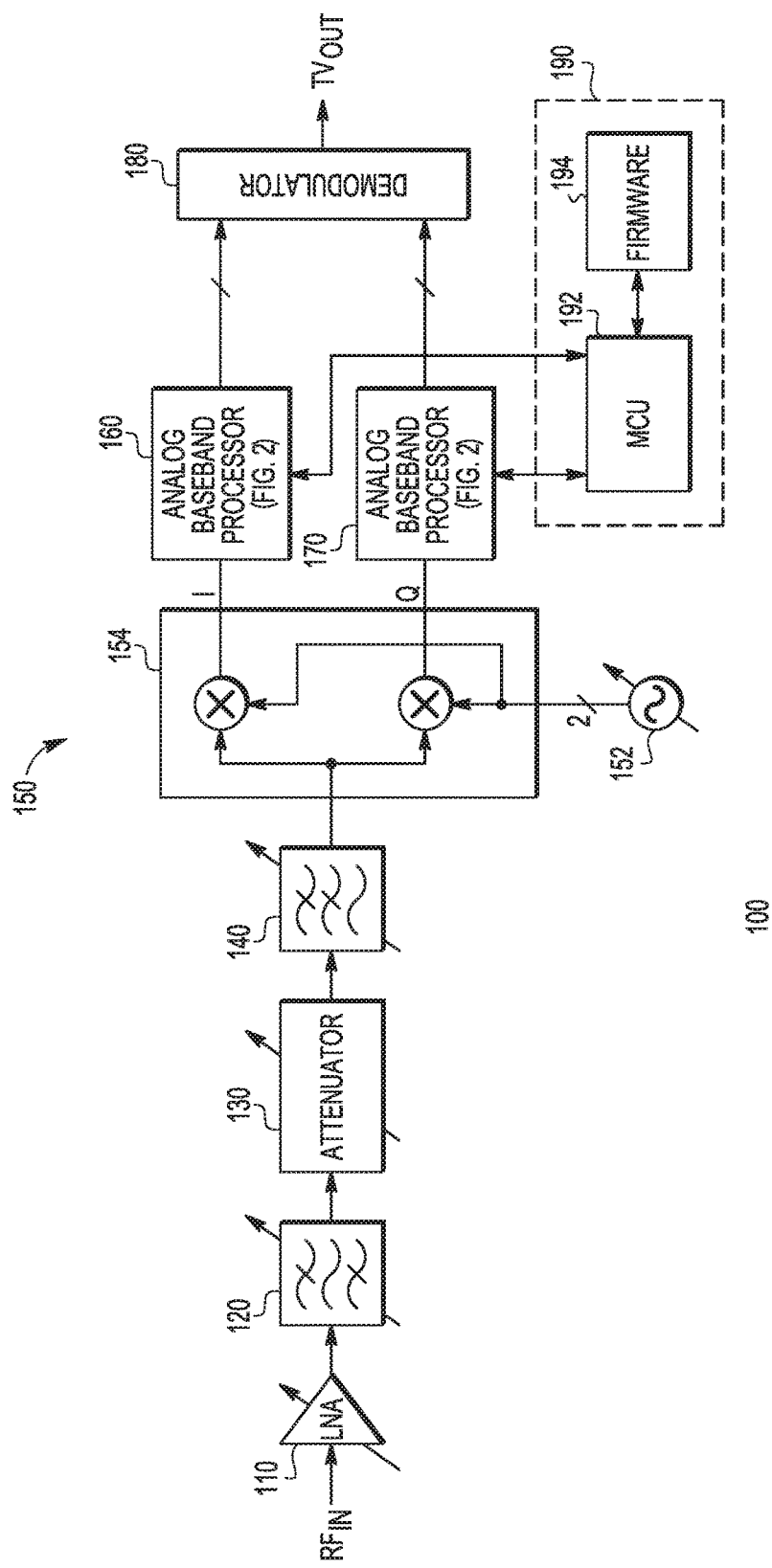
FIG. 1 illustrates in block diagram form an integrated circuit television receiver according to an embodiment of the present invention.

FIG. 1 illustrates in block diagram form an integrated circuit television receiver 100 according to an embodiment of the present invention. Receiver 100 includes generally a low noise amplifier (LNA) 110, a bandpass filter 120, an attenuator 130, a lowpass filter 140, a mixing circuit 150, an analog baseband processor 160 for the in-phase (I) path, an analog baseband processor 170 for the quadrature (Q) path, a demodulator 180, and a controller 190. LNA 110 has an input for receiving a radio frequency (RF) input signal labeled "$RF_{IN}$", a control input for receiving a gain control signal, and an output. While FIG. 1 depicts a television receiver, it is applicable to other RF systems. In general a "radio frequency" signal means an electrical signal conveying useful information and having a frequency from about 3 kilohertz (kHz) to hundreds of gigahertz (GHz), regardless of the medium through which such signal is conveyed. Thus an RF signal may be transmitted through air, free space, coaxial cable, fiber optic cable, etc. Tracking bandpass filter 120 has a first input connected to the output of LNA 110, a second input for receiving a tuning signal, and an output. Attenuator 130 has a first input connected to the output of tracking bandpass filter 120, a second input for receiving an attenuation control signal, and an output. Filter 140 has a first input connected to the output of attenuator 130, a second input for receiving a cutoff frequency adjustment signal, and an output.

Mixing circuit 150 includes a local oscillator 152 and a mixer 154. Local oscillator 152 has an input for receiving a local oscillator tuning signal, and an output for providing two signals, including an in-phase mixing signal and a quadrature mixing signal. Mixer 154 has a first input connected to the output of filter 140, a second input connected to the output of local oscillator 152, a first output for providing an in-phase intermediate frequency (IF) signal labeled "I", and a second output for providing a quadrature IF signal labeled "Q".

Analog baseband processor 160 has a signal input connected to the output of mixer 152 for receiving signal I, a control input/output terminal, and an output. Analog baseband processor 170 has a signal input connected to the output of mixer 152 for receiving signal Q, a control input/output terminal, and an output. Demodulator 180 has a first input connected to the output of analog baseband processor 160, a second input connected to the output of analog baseband processor 170, and an output for providing a demodulated baseband television signal labeled "$TV_{OUT}$".

Controller 190 includes a microcontroller (MCU) 192 and firmware 194. MCU 190 has a first input/output terminal connected to the control input/output terminal of analog baseband processor 160, a second input/output terminal connected to the control input/output terminal of analog processor 170, and a bidirectional memory interface terminal between it and firmware 194. MCU 192 has outputs for controlling LNA 110, filter 120, attenuator 130, filter 140, and local oscillator 152. MCU 192 also has other inputs and outputs not important in understanding the relevant operation of receiver 100 and which are not shown in FIG. 1.

Generally, receiver 100 functions as a television receiver adapted to receive and demodulate television channels from sources including broadcast and cable television. MCU 192 is adapted to control the various elements in receiver 100 according to the channel selected by the user and under the control of a program stored in firmware 194.

Receiver 100 uses a dual-filter architecture for the pre-mixing tuner. Signal $RF_{IN}$ is received and amplified as necessary in LNA 110 under the control of MCU 192. Receiver 100 is thus able to present a signal to the input of tracking bandpass filter 120 at a suitable level. Tracking bandpass filter 120 is a second-order LC filter that assists in providing rejection for strong interferers (or blockers) by filtering neighboring channels. The center frequency of the passband of tracking bandpass filter 120 is set by MCU 192 according to the selected channel.

Attenuator 130 functions as a separately controllable gain element under the control of MCU 192 such that MCU 192 can appropriately divide the gain or attenuation between different portions of the signal processing path. Filter 140 provides additional attenuation above the third harmonic of the mixing signal under the control of MCU 192 to prevent unwanted energy from a neighboring channel from being mixed into the passband. This third harmonic frequency is important because local oscillator 154 uses a digital mixing signal that is a square wave, which therefore has significant energy at its third harmonic.

Mixer 154 is a quadrature mixer that mixes the filtered and attenuated RF input signal with the signal from local oscillator 152 to mix a selected channel to a desired IF. In receiver 100, the desired IF is selectable in the range of 3 to 5 megahertz (MHz), and thus receiver 100 is configurable as a low-IF (LIF) receiver. Additionally, receiver 100 is also configurable as a direct down conversion receiver or zero IF (ZIF) receiver. Local oscillator 152 is tuned to a frequency that mixes the selected channel to the desired IF, under the control of MCU 192. Receiver 100 is also configurable to be compatible with various television standards around the world that have somewhat different channel and spectral characteristics.

Each of analog baseband processors 160 and 170 is a signal processor that performs signal conditioning, including lowpass filtering to pass signals below a cutoff frequency of between 6 and 9 MHz for LIF configurations, and further gain stages under the control of MCU 192. Note that as used herein, signal processors 160 and 170 are considered to be "baseband" in the sense that they support either LIF or ZIF. Analog baseband processors 160 and 170 convert the analog signals so processed to the digital domain, such that demodulator 180 can demodulate them digitally to provide signal $TV_{OUT}$.

Figure 2:
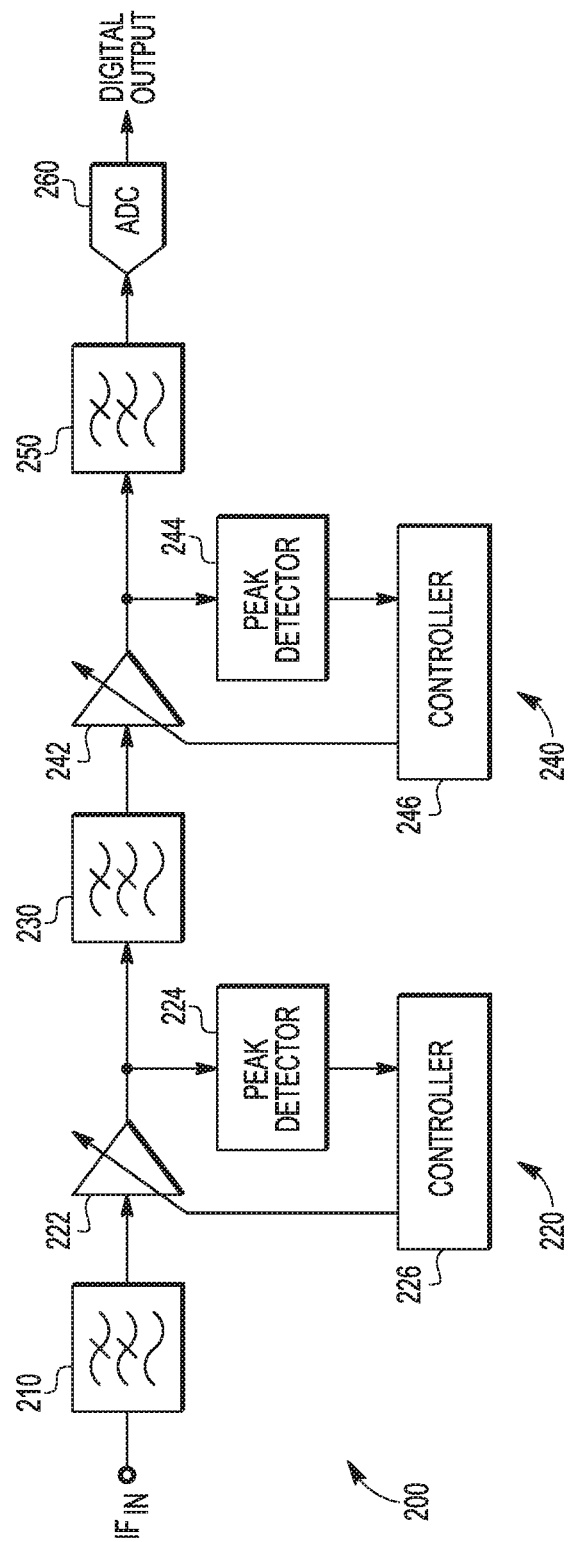
FIG. 2 illustrates in block diagram form an analog baseband processor suitable for use as one of the analog processors of FIG. 1.

FIG. 2 illustrates in block diagram form an analog baseband processor 200 suitable for use as either analog baseband processor 160 or analog baseband processor 170 of FIG. 1. Analog baseband processor 200 includes generally a lowpass filter 210, a first automatic gain control (AGC) loop 220, a lowpass filter 230, a second AGC loop 240, a lowpass filter 250, and an ADC 260. Lowpass filter 210 has an input for receiving an input signal labeled "$IF_{IN}$", and an output. AGC loop 220 has an input connected to the output of lowpass filter 210, and an output. Lowpass filter 230 has an input connected to the output of AGC loop 220, and an output. AGC loop 240 has an input connected to the output of lowpass filter 230, and an output. Lowpass filter 250 has an input connected to the output of AGC loop 240, and an output. ADC 260 has an input connected to the output of lowpass filter 250, and an output for providing a digital output signal labeled "DIGITAL OUTPUT".

AGC loop 220 includes a programmable gain amplifier (PGA) 222, a peak detector 224, and a controller 226. PGA 222 has an input connected to the output of lowpass filter 210, a control input, and an output connected to the input of lowpass filter 230. Peak detector 224 has an input connected to the output of PGA 222, and an output. Controller 226 has an input connected to the output of peak detector 224, and an output connected to the control input of PGA 222. AGC loop 240 includes a PGA 242, a peak detector 244, and a controller 246. PGA 242 has an input connected to the output of lowpass filter 230, a control input, and an output connected to the input of lowpass filter 250. Peak detector 244 has an input connected to the output of PGA 242, and an output. Controller 246 has an input connected to the output of peak detector 244, and an output connected to the control input of PGA 242. Controllers 226 and 246 are implemented by MCU 192 under the control of firmware 194 as illustrated previously in FIG. 1.

In general, analog baseband processor 200 provides filtering to attenuate significant channel blockers while effectively utilizing the available dynamic range of ADC 260. Analog baseband processor 200 implements distributed independent gain control and distributed filtering that allows it to accommodate varying television reception environments while avoiding the need for extremely aggressive filtering associated with conventional designs. In the illustrated embodiment, analog baseband processor 200 implements a distributed fifth-order lowpass filter, realizing two of the poles using simple passive resistor-capacitor (RC) filters, and only three of the poles using active elements. In particular, lowpass filter 210 combines a first-order passive RC stage followed by a first-order active lowpass filter. The active filter portion injects a fixed amount of gain, about 8 decibels (dB) in the contemplated embodiment. Lowpass filter 230 uses an active biquadratic (biquad) filter to provide two additional poles. Finally lowpass filter 250 uses another first-order passive RC filter.

In this embodiment, to accommodate both LIF and ZIF architectures, the corner frequency of the distributed lowpass filter can be altered to points between 3-9 MHz in 250 kHz steps. The corner frequency is set by adjusting digitally tunable capacitor banks that implement filter capacitors. In LIF mode, the IF can be set anywhere between 3 MHz and 5 MHz. In the contemplated embodiment, analog baseband processors 160 and 170 also include on-chip calibration circuits for calibrating RC time constants associated with filter poles.

Moreover in this embodiment, each PGA has a gain range of 18 decibels (dB) with 0.5 dB steps each having a relative gain accuracy of 0.025 dB.

Figure 3:
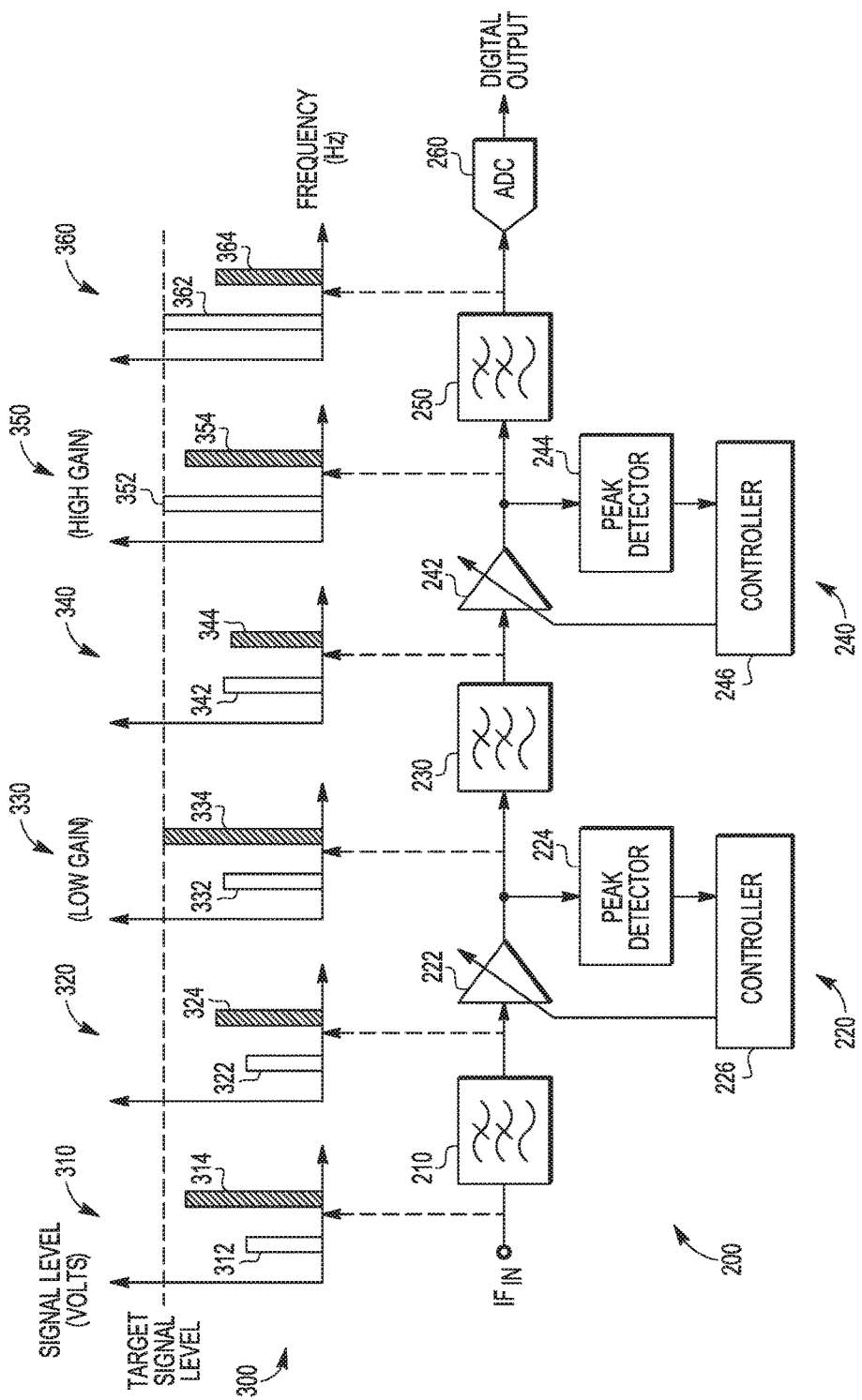
FIG. 3 illustrates in graphical form a set of graphs useful in understanding the operation of the analog baseband processor of FIG. 2 in the presence of a strong adjacent channel blocker.
Figure 4:
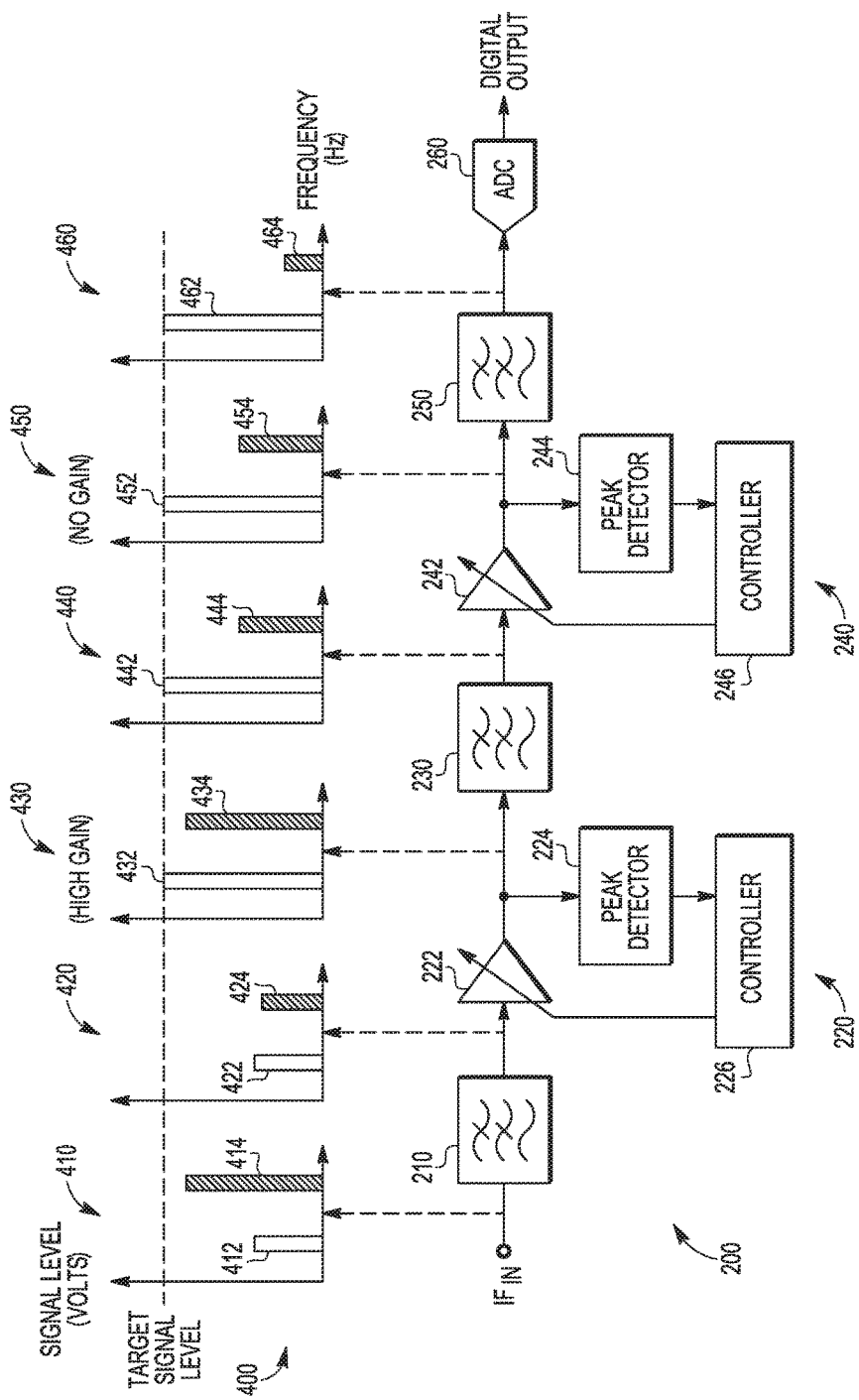
FIG. 4 illustrates in graphical form a set of graphs useful in understanding the operation of analog baseband processor of FIG. 2 in the presence of a strong remote channel blocker.

The advantages of distributed filtering and gain control with independent AGC loops can be better understood with reference to FIGS. 3 and 4. FIG. 3 illustrates in graphical form a set of graphs 300 useful in understanding the operation of analog baseband processor 200 of FIG. 2 in the presence of a strong adjacent channel blocker. To aid understanding, analog baseband processor 200 of FIG. 2 is also reproduced below the graphs. Graphs 300 include six graphs 310-360. In each graph the horizontal axis represents frequency in hertz (Hz) and the vertical axis represents amplitude in volts. Each graph illustrates the signal level of the desired signal 312-362, respectively, and of the blocker 314-364, respectively, at various nodes in analog baseband processor 200 as indicated in FIG. 3. As shown in graph 310, the signal at the input of lowpass filter 210 includes desired signal 312 and blocker 314 both having amplitudes less than a target signal level. The target signal level is an analog level corresponding to the dynamic range of ADC 260. Lowpass filter 210 attenuates the blocker as shown in graph 320 to make the signal level of desired signal 322 closer to that of blocker 324. AGC loop 220 increases the signal levels of both the desired signal and the blocker until the gain is sufficient to increase the strongest signal of the two, in this case blocker 334, to the target signal level. Subsequently lowpass filter 330 decreases the signal level of the blocker and, as shown in FIG. 3, the amplitude of desired signal 342 becomes higher than that of blocker 344. AGC loop 240 increases the signal levels of both the desired signal and the blocker but now uses the signal level of desired signal 342 to determine the gain. Finally lowpass filter 250 decreases the signal level of the blocker while maintaining the level of desired signal 362, which remains at the target level at the input of ADC 260. Thus the operation of analog baseband processor 200 in the presence of a strong adjacent blocker causes PGA 222 to have low gain and PGA 242 to have high gain.

FIG. 4 illustrates in graphical form a set of graphs 400 useful in understanding the operation of analog baseband processor 200 of FIG. 2 in the presence of a strong remote channel blocker. As in FIG. 3, analog baseband processor 200 of FIG. 2 is again reproduced. Graphs 400 include six graphs 410-460. In each graph the horizontal axis represents frequency in hertz (Hz) and the vertical axis represents amplitude in volts. Each graph illustrates the signal level of the desired signal 412-462, respectively, and of the blocker 414-464, respectively. As shown in graph 410, the signal at the input of lowpass filter 210 includes the desired signal 412 and the blocker 414 both having amplitudes less than the target signal level. Lowpass filter 210 attenuates the blocker as shown in graph 420 to make the signal level of desired signal 422 closer to that of blocker 424. Note that the attenuation of blocker 424 is relatively greater since the blocker is farther away in frequency. AGC loop 220 increases the signal levels of both the desired signal and the blocker until the gain is sufficient to increase the strongest signal of the two, in this case desired signal 432, to the target level. In the example of FIG. 4, the desired signal has an amplitude much smaller than the target level so AGC loop 220 sets the gain of PGA 222 to a high gain. Subsequently lowpass filter 230 decreases the signal level of the blocker. AGC loop 240 is configured to increase the signal levels of both the desired signal and the blocker but, as illustrated in FIG. 4, the desired signal already has an amplitude at the desired level so AGC loop 240 sets the gain of PGA 242 to 1. Finally lowpass filter 250 decreases the signal level of the blocker further while maintaining the level of desired signal 462, which remains at the target level at the input of ADC 260. Thus the operation of analog baseband processor 200 in the presence of a strong remote blocker causes PGA 222 to have high gain and PGA 242 to have no gain.

Thus by the use of distributed filtering with independent AGC loops, analog baseband processor 200 utilizes the full dynamic range of ADC 260 while attenuating strong out-of-band blockers that may be either adjacent channels or more remote channels. Conventional television receivers do not include baseband ADCs and tend to have aggressive baseband filters, which may be up to eighth order. By distributing AGC loops among the filters and performing additional filtering and down conversion digitally, analog baseband processor 200 is thus simpler and less expensive than conventional designs.

Thus as seen from the illustrated embodiment in FIGS. 3 and 4, two AGC loops appear to be coordinated in achieving appropriate gain settings for different types of blockers even though they operate independently. In an alternate embodiment, the loops can provide a "take-over" option. With this option, the AGC loops operate independently unless one of the AGC loops exhausts its gain range, by reaching either minimum or maximum gain. Once one AGC loop has exhausted its gain range, it signals the other AGC loop, which then may set its gain based on levels at other points in the analog baseband chain.

Figure 5:
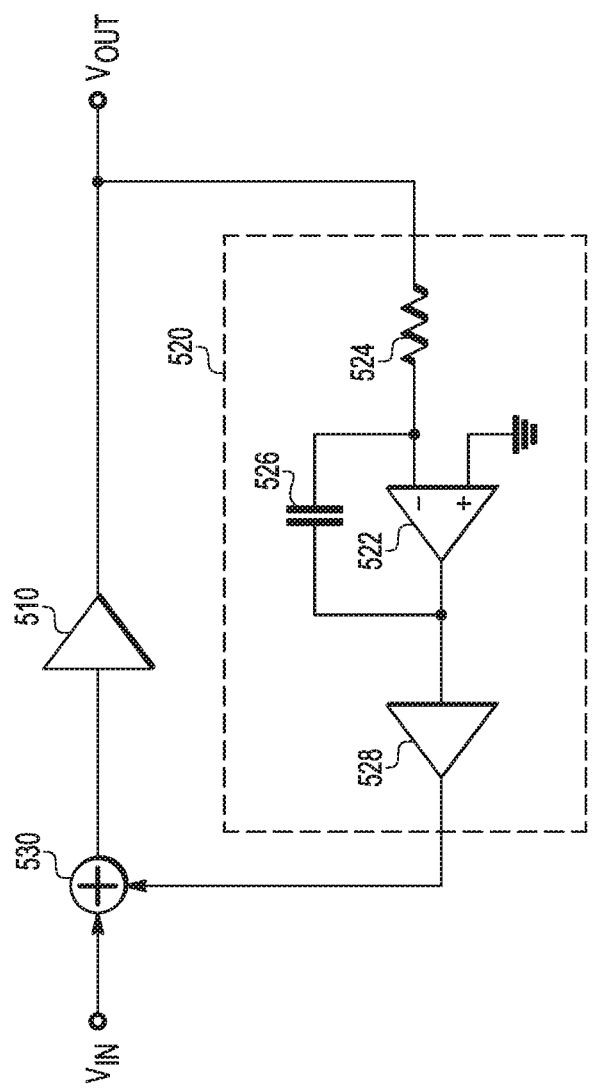
FIG. 5 illustrates in block diagram form a programmable gain amplifier with analog direct current (DC) offset correction known in the prior art.

While the design of analog baseband processor 200 is robust, it also simply and efficiently corrects offset voltages introduced by non-ideal characteristics of the actual circuit elements. FIG. 5 illustrates in block diagram form a programmable gain amplifier (PGA) with analog direct current (DC) offset correction 500 known in the prior art. PGA 500 includes an amplifier 510, a DC offset correction circuit (DCOC) 520, and a summing device 530. Amplifier 510 has an input, and an output for providing an output signal labeled "$V_{OUT}$". DCOC 520 includes an operational amplifier 522, a resistor 524, a capacitor 526, and an amplifier 528. Operational amplifier 522 has an inverting input, a non-inverting input connected to ground, and an output. Resistor 524 has a first terminal connected to the output terminal of PGA 510, and a second terminal connected to the inverting input of operational amplifier 522. Capacitor 526 has a first terminal connected to the inverting input of operational amplifier 522, and a second terminal connected to the output terminal of operational amplifier 522. Amplifier 528 has an input connected to the output terminal of operational amplifier 522, and an output terminal. Summing device 530 has a first input terminal for receiving an input voltage labeled "$V_{IN}$", a second input connected to the output of amplifier 528, and an output connected to the input of PGA 510.

PGA 500 implements DC offset correction by placing active lowpass filter 520, formed by operational amplifier 522, resistor 524, and capacitor 526, in a closed loop around PGA 510. Placing lowpass filter 520 in a feedback path creates an overall highpass response that attenuates DC offset voltages. However when used in baseband architectures, especially ZIF, PGA 500 rejects some low frequency content and thus distorts the desired signal. Also to bring the corner frequency of the highpass filter as low as possible, this type of DCOC topology requires large filter capacitors. Besides consuming a large amount of integrated circuit area, the larger capacitors also increase settling time after gain changes. Thus a new technique of offset correction that overcomes these problems would be desirable.

Figure 6:
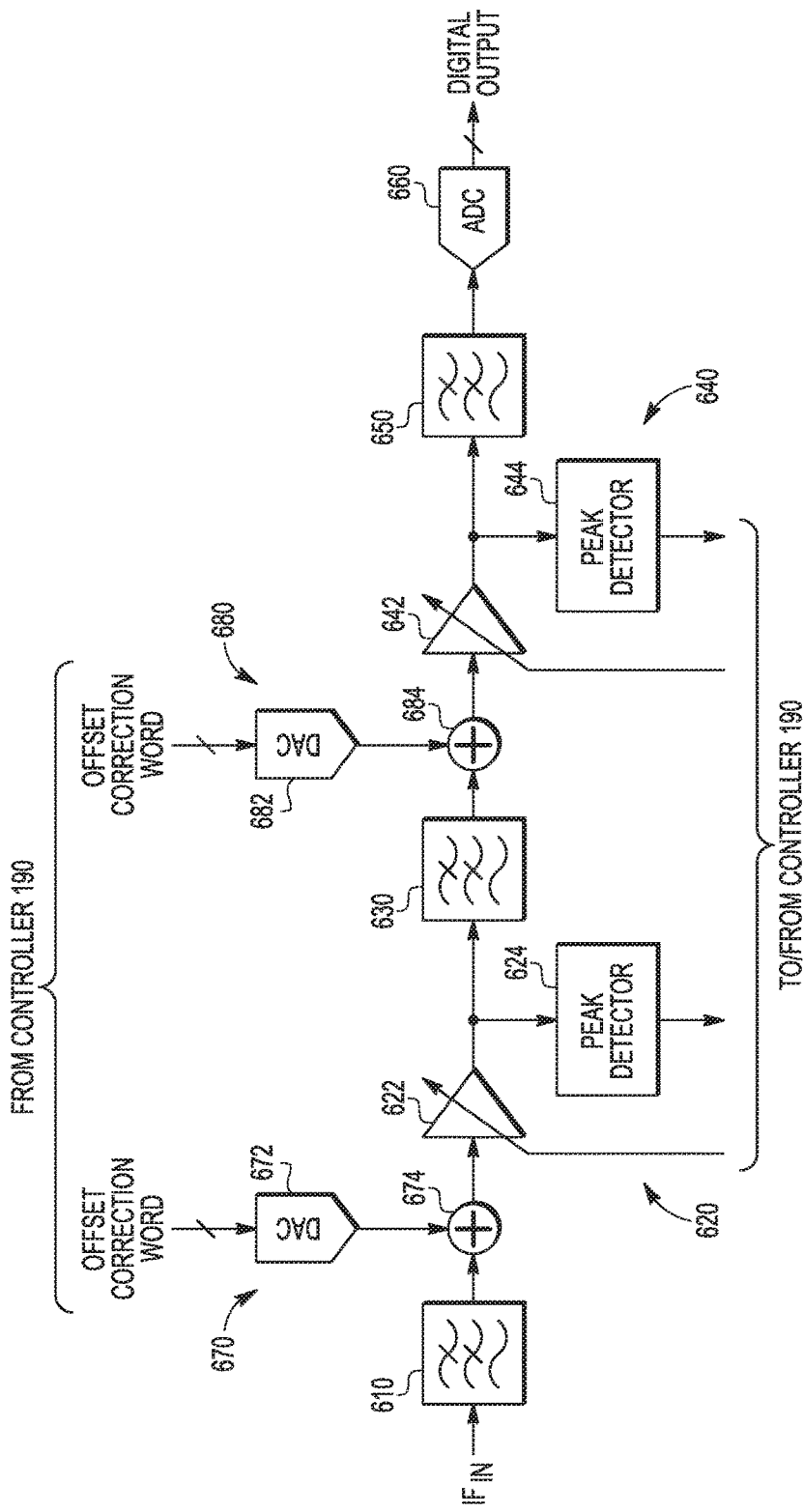
FIG. 6 illustrates in block diagram form a signal processor with offset correction suitable for use as one of the analog baseband processors of FIG. 1 according to another aspect of the present invention.

FIG. 6 illustrates in block diagram form an analog baseband processor 600 with offset correction suitable for use as either analog baseband processor 160 or analog baseband processor 170 of FIG. 1 according to another aspect of the present invention. Analog baseband processor 600 includes generally a lowpass filter 610, a first AGC loop 620, a lowpass filter 630, a second AGC loop 640, a lowpass filter 650, and an ADC 660. Lowpass filter 610 has an input for receiving input signal $IF_{IN}$, and an output. AGC loop 620 has an input, and an output. Lowpass filter 630 has an input connected to the output of AGC loop 620, and an output. AGC loop 640 has an input, and an output. Lowpass filter 650 has an input connected to the output of AGC loop 640, and an output. ADC 660 has an input connected to the output of lowpass filter 650, and an output for providing the DIGITAL OUTPUT signal.

AGC loop 620 includes a PGA 622, a peak detector 624, and a controller implemented using controller 190. PGA 622 has an input, a control input received from MCU 192, and an output connected to the input of lowpass filter 630. Peak detector 624 has an input connected to the output of PGA 622, and an output provided to MCU 192. AGC loop 640 includes a PGA 642, a peak detector 644, and a controller implemented using controller 190. PGA 642 has an input, a control input received from MCU 192, and an output connected to the input of lowpass filter 650. Peak detector 644 has an input connected to the output of PGA 642, and an output provided to MCU 192.

Analog baseband processor 600 also includes DCOC circuits 670 and 680. DCOC circuit 670 includes a digital-to-analog converter (DAC) 672 and a summing device 674. DAC 672 has an input for receiving a 5-bit offset correction word from MCU 192, and an output. Summing device 674 has a first input connected to the output of lowpass filter 610, a second input connected to the output of DAC 672, and an output connected to the input of PGA 622. DCOC circuit 680 includes a DAC 682 and a summing device 684. DAC 682 has an input for receiving a 5-bit offset correction word from MCU 192, and an output. Summing device 684 has a first input connected to the output of lowpass filter 630, a second input connected to the output of DAC 682, and an output connected to the input of PGA 642.

DCOC circuits 670 and 680 overcome the disadvantages of DCOC circuit 500 of FIG. 5: they use low-resolution (5-bit in the illustrated example) DACs that are small in area compared to the feedback DCOC filters shown in FIG. 5, and do not attenuate low frequency content of the desired signal. In addition, they settle faster compared to DCOC circuit 500 of FIG. 5. Having dedicated offset correction for each PGA allows better utilization of the available dynamic range of ADC 660.

Now considering FIGS. 1 and 6 together, controller 190 determines offset correction words at power up using available circuitry. Firmware 194 controls ADC 660 to measure the voltage at the output of lowpass filter 650, as will be described more fully below. Firmware 194 causes MCU 192 to measure and store offsets at different gain settings. Then during operation whenever a gain change is performed, appropriate gain values can be retrieved from memory and used to determine accurate offset values.

Calibration generally proceeds as follows. Controller 190 grounds $IF_{IN}$ and changes the settings of PGAs 622 and 642 to three different combinations. By making measurements at the output of lowpass filter 650 under three different gain combinations, controller 190 defines three equations in three variables, which can be solved using conventional algebraic substitution. Moreover by a careful choice of gain values to be binarily related, the computations can be greatly simplified. These operations are detailed below.

The offset at the input to PGA 622, designated "$V_{OS1}$", includes the local oscillator leakage of mixer 150, the output offset of the second, active lowpass filter in lowpass filter 610, and the input referred offset voltage of PGA 622 itself. The offset at the input to PGA 642, designated "$V_{OS2}$", includes the output offset of the active biquad filter forming lowpass filter 630 and the input referred offset voltage of PGA 642 itself. The offset at the output of lowpass filter 650, designated "$V_{OS3}$", simply includes the input referred offset voltage of ADC 660.

The three offsets can be understood by how many gain stages they go through. $V_{OS1}$ is amplified by both PGA 622 and PGA 642; $V_{OS2}$ is only amplified by PGA 642; and $V_{OS3}$ does not go through any amplification. Thus the analog baseband chain output referred offset voltage, designated $V_{OSout}$, is given by $$V_{OSout} = G_{PGA1}G_{PGA2}V_{OS1} + G_{PGA2}V_{OS2} + V_{OS3} \quad [1]$$

in which $G_{PGA1}$ represents the gain of PGA 622 and $G_{PGA2}$ represents the gain of PGA 642.

Equation [1] includes three unknowns, namely the equivalent offset voltages. Controller 190 controls the various elements in analog baseband chain 600 to change the gain settings and then to make the three required measurements. TABLE 1 illustrates the general case for the measurements:

TABLE 1

| Measurement No. | PGA 622 Gain | PGA 642 Gain | Output Offset |
|---|---|---|---|
| 1 | $G_{PGA1\_1}$ | $G_{PGA2\_1}$ | $V_{OSout\_1}$ |
| 2 | $G_{PGA1\_2}$ | $G_{PGA2\_2}$ | $V_{OSout\_2}$ |
| 3 | $G_{PGA1\_3}$ | $G_{PGA2\_3}$ | $V_{OSout\_3}$ |

With three measurements at the output of ADC 660, the following three different digitized output voltages are obtained:

$$V_{OSout\_1} = G_{PGA1\_1}G_{PGA2\_1}V_{OS1} + G_{PGA2\_1}V_{OS2} + V_{OS3} \quad [2]$$

$$V_{OSout\_2} = G_{PGA1\_2}G_{PGA2\_2}V_{OS1} + G_{PGA2\_2}V_{OS2} + V_{OS3} \quad [3]$$

$$V_{OSout\_3} = G_{PGA1\_3}G_{PGA2\_3}V_{OS1} + G_{PGA2\_3}V_{OS2} + V_{OS3} \quad [4]$$

Since these measurements yield three equations in three unknowns, one can solve for $V_{OS3}$, $V_{OS3}$, and $V_{OS3}$ using algebraic substitution.

However there are opportunities to simplify the calculations to allow them to be made more easily using MCU 192. The math can be simplified if one uses two different gain settings (instead of three) for each PGA with the following combinations and further uses the relationship given in Equation [8] below:

$$V_{OSout\_1} = G_{PGA1\_1} G_{PGA2\_1} V_{OS1} + G_{PGA2\_1} V_{OS2} + V_{OS3} \quad [5]$$

$$V_{OSout\_2} = G_{PGA1\_2} G_{PGA2\_1} V_{OS1} + G_{PGA2\_1} V_{OS2} + V_{OS3} \quad [6]$$

$$V_{OSout\_3} = G_{PGA1\_1} G_{PGA2\_2} V_{OS1} + G_{PGA2\_2} V_{OS2} + V_{OS3} \quad [7]$$

$$G_{PGA1\_2} \times G_{PGA2\_1} = G_{PGA1\_1} \times G_{PGA2\_2} \quad [8]$$

which allows the offset equations to be simplified as follows:

$$V_{OS1} = \frac{V_{OS,out\_2} - V_{OS,out\_1}}{G_{PGA2\_1}(G_{PGA1\_2} - G_{PGA1\_1})} \quad [9]$$

$$V_{OS2} = \frac{V_{OS,out\_3} - V_{OS,out\_2}}{G_{PGA2\_2} - G_{PGA2\_1}} \quad [10]$$

$$V_{OS3} = V_{OS,out\_1} - G_{PGA1\_1} G_{PGA2\_1} V_{OS1} - G_{PGA2\_1} V_{OS2} \quad [11]$$

Further simplification can be achieved by selecting values of $G_{PGA1\_1}$, $G_{PGA1\_2}$, $G_{PGA2\_1}$, and $G_{PGA2\_2}$ so that evaluation of equations [9]-[11] becomes trivial and thus can be achieved easily with a conventional MCU. The inventors chose the values in TABLE 2 below:

TABLE 2

| Measurement No. | PGA 622 Gain | PGA 642 Gain | Output Offset |
|---|---|---|---|
| 1 | 2× | 2× | $V_{OSout\_1}$ |
| 2 | 4× | 2× | $V_{OSout\_2}$ |
| 3 | 2× | 4× | $V_{OSout\_3}$ |

Under these circumstances, equations [9]-[11] are simplified as follows:

$$V_{OS1} = \frac{V_{OS,out\_2} - V_{OS,out\_1}}{4} \quad [12]$$

$$V_{OS2} = \frac{V_{OS,out\_3} - V_{OS,out\_2}}{2} \quad [13]$$

$$V_{OS3} = V_{OS,out\_1} - 4V_{OS1} - 2V_{OS2} \quad [14]$$

Evaluation of these equations requires no multiplication or division operations and these equations can be evaluated with simple binary arithmetic using shift and add operations. Once $V_{OS1}$-$V_{OS3}$ are determined, MCU 192 provides the offset correction words so determined to DACs 672 and 682.

Figure 7:
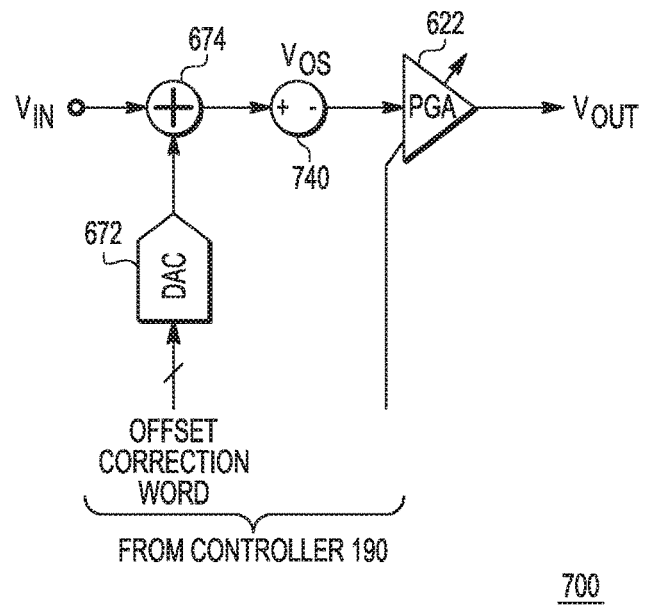
FIG. 7 illustrates a circuit model of a portion of the analog baseband processor of FIG. 6 useful in understanding the calibration operation.

The offset correction values are computed differently, however, based on the configuration of the PGA. FIG. 7 illustrates in partial block diagram and partial schematic form a PGA 700 useful in understanding the offset correction operation. PGA 700 includes DAC 672, summing device 674, and PGA 622 configured substantially as shown in FIG. 6. In addition, however, the offset voltage is modeled as a voltage source 710 connected in series between the output terminal of summing device 674 and the input of PGA 622 with its positive terminal connected to the output terminal of summing device 674 and its negative terminal connected to the input terminal of PGA 622. If PGA 700 is configured as illustrated in FIG. 7, the offset correction words do not need to be modified when the gain of PGA 622 changes during normal operation. This relationship holds for PGA 642 as well.

Figure 8:
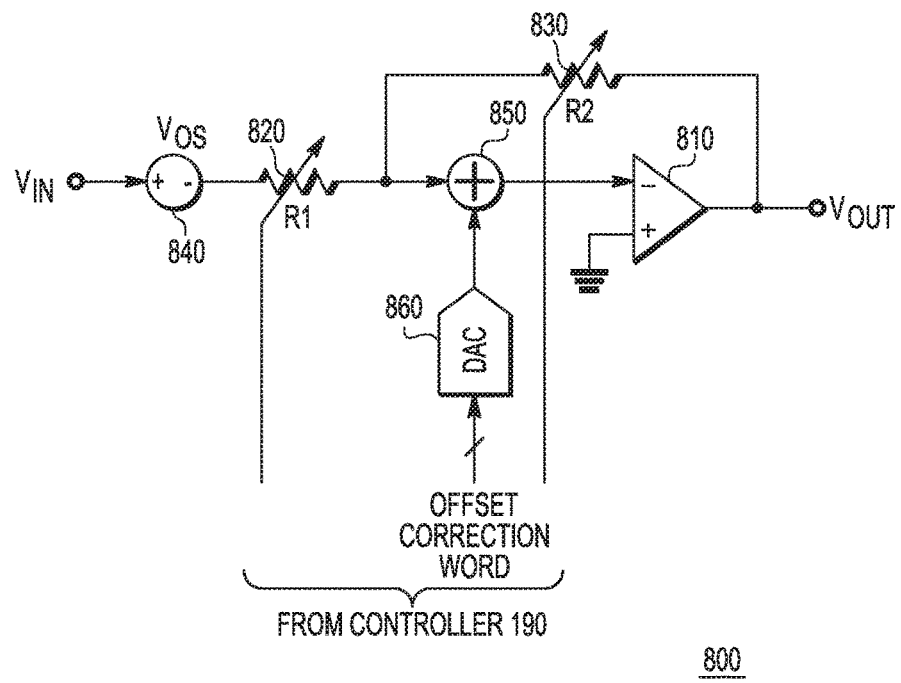
FIG. 8 illustrates a circuit model of a portion of an analog baseband processor according to another embodiment of the present invention.

However in another embodiment PGAs 622 and 642 can be configured in a way that requires modification of the offset correction words based on the gain setting. This configuration is better understood with respect to FIG. 8, which illustrates in partial block diagram and partial schematic form another embodiment of a PGA 800 according to the present invention. PGA 800 includes an operational amplifier 810, variable resistors 820 and 830, an offset voltage source 840, a summing device 850, and a DAC 860. Operational amplifier 810 has an inverting input terminal, a non-inverting input terminal connected to ground, and an output terminal for providing an output voltage $V_{OUT}$. Resistor 820 has a first terminal, a second terminal, and a control terminal for receiving a control signal from MCU 192. Resistor 830 has a first terminal connected to the second terminal of resistor 820, a second terminal connected to the output of operational amplifier 810, and a control terminal for receiving a control signal from MCU 192. Summing device 850 has a first input connected to the second terminal of resistor 820, a second input, and an output connected to the inverting input terminal of operational amplifier 810. DAC 860 has an input terminal for receiving the offset correction word from MCU 192, and an output terminal connected to the second input of summing device 850. Offset voltage source 840 is connected in series between the input of the PGA and the first terminal of resistor 820 with its positive terminal receiving input voltage $V_{IN}$, and its negative terminal connected to the first terminal of resistor 820.

MCU 192 sets the gain of PGA 800 by changing the values of resistors 820 and 830. Since DAC 860 provides an input inside PGA 800, the digitized offset cannot be applied directly to the input of DAC 860, but instead needs to be modified as follows:

$$V'_{OS1} = \frac{G_{PGA1}}{(1 + G_{PGA1})} \times V_{OS1} \quad [15]$$

$$V'_{OS2} = \frac{G_{PGA2}}{(1 + G_{PGA2})} \times V_{OS2} \quad [16]$$

Thus the offset correction words are gain dependent. During normal operation, whenever a gain change is made to any PGA, the corresponding updated offset correction words should be applied at the same time. Note that the settling time after such a gain change is much faster than the settling time of an analog DCOC circuit such as DCOC circuit 520 shown in FIG. 5.

Thus a signal processor such as disclosed above is suitable for use in an LIF or ZIF architecture receivers by distributing filtering and gain stages. The signal processor is able to establish proper gain and filter settings to utilize available dynamic range even when the characteristics of channel blockers change. Moreover offset voltages present in active elements such as PGAs and active filters are corrected with digital-to-analog converters (DACs) that convert stored digital correction words into analog offset corrections. This type of offset correction avoids conventional highpass DCOC circuits that would attenuate desired signal content when used in receivers with ZIF and LIF architectures. These values are determined during a calibration procedure at startup by making multiple measurements using an existing ADC. By making certain related gain settings and then measuring the output digital value, multiple offsets can be determined using simple algebraic substitution.

Various modifications will be apparent from the foregoing description. For example, in the illustrated embodiment controller 190 was implemented with an MCU and firmware. In particular, MCU 192 executed stored program instructions from firmware 194 to implement the AGC loop control and offset calibration functions. In other embodiments, these functions can be performed with different types of controllers using hardware, software, or different combinations of the two. While the signal processing uses differential signals, in other embodiments it may use single-ended signals instead. Moreover while the signal processor described herein was designed for a multi-standard television receiver, in other embodiments the signal processor could be used in other type of RF systems. The ADCs contemplated herein are 3-bit delta-sigma ADCs, but could be implemented using other known ADC architectures. Also the signal processor was disclosed in the context of an analog baseband processor, but the principles used could also be used for digital processors and processors used with higher IFs.

Therefore above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A signal processor for a radio frequency (RF) receiver, comprising:
   a first digital-to-analog converter having an input for receiving a first offset correction word, and an output;
   a first summing device having a first input receiving an input signal, a second input coupled to said output of said first digital-to-analog converter, and an output;
   a first programmable gain amplifier having an input coupled to said output of said first summing device, a control input, and an output; and
   a second digital-to-analog converter having an input for receiving a second offset correction word, and an output;
   a second summing device having a first input coupled through at least one signal processing element to said output of said first programmable gain amplifier, a second input coupled to said output of said second digital-to-analog converter, and an output;
   a second programmable gain amplifier having an input coupled to said output of said second summing device, a control input, and an output; and
   a controller having a first output coupled to said input of said first digital-to-analog converter for providing said first offset correction word to correct a first offset introduced by said first programmable gain amplifier, and a second output coupled to said input of said second digital-to-analog converter for providing said second offset correction word to correct a second offset introduced by said second programmable gain amplifier, and determining said first and second offset correction words by varying gains of said first and second programmable gain amplifiers during a plurality of measurements.

2. The signal processor of claim 1 wherein said first input of said second summing device is coupled through at least one active signal processing element to said output of said first programmable gain amplifier, and said controller provides said second offset correction word to correct said second offset and a third offset introduced by said at least one active signal processing element.

3. The signal processor of claim 2 wherein said at least one active signal processing element comprises a first low-pass filter.

4. The signal processor of claim 1 further comprising:
   an analog-to-digital converter having an input coupled to said output of said second programmable gain amplifier, and an output for providing a digital output signal.

5. The signal processor of claim 4 wherein said input of said analog-to-digital converter is coupled to said output of said second programmable gain amplifier through a second lowpass filter.

6. The signal processor of claim 4 wherein:
   said controller determines said first and second offsets and a final offset by measuring said outputs of said first and second summing devices and said input of said analog-to-digital converter for three different gain combinations of said first and second programmable gain amplifiers.

7. The signal processor of claim 6 wherein said controller determines said first and second offsets and said final offset further by evaluating three equations in three variables using algebraic substitution.

8. The signal processor of claim 7 wherein said controller provides said three different gain combinations using binarily related gain amounts.

9. The signal processor of claim 1 wherein said controller varies said first offset correction word proportionally to an offset voltage of said first programmable gain amplifier.

10. The signal processor of claim 1 wherein said controller sets a gain of said first programmable gain amplifier using first and second variable resistors, and varies said first offset correction word in response to both an offset voltage of said first programmable gain amplifier and to values of said first and second variable resistors.

11. A signal processor for a radio frequency (RF) receiver, comprising:
    a signal processing path comprising:
       a first programmable gain amplifier;
       a second programmable gain amplifier;
       a first offset correction circuit for receiving a first digital offset correction word and for correcting a first offset of said first programmable gain amplifier by adding a first value corresponding to said first digital offset correction word to an input of said first programmable gain amplifier; and
       a second offset correction circuit for receiving a second digital offset correction word and for correcting a second offset of said second programmable gain amplifier by adding a first value corresponding to said second digital offset correction word to an input of said second programmable gain amplifier,
    a controller coupled to said signal processing path for measuring offsets of said first and second programmable gain amplifiers during a calibration, and providing said first and second offset correction words in response to said offsets.

12. The signal processor of claim 11 wherein each of said first and second offset correction circuits comprises:
   a digital-to-analog converter having an input for receiving a respective one of said first and second offset correction words, and an output; and
   a first summing device having a first input receiving a respective input signal from said signal processing path, a second input coupled to said output of said digital-to-analog converter, and an output coupled to an input of a respective one of said first and second programmable gain amplifiers.

13. The signal processor of claim 11 wherein said controller sets a gain of said first programmable gain amplifier using first and second variable resistors, and varies said first offset correction word in response to both an offset voltage of said first programmable gain amplifier and to values of said first and second variable resistors.

14. The signal processor of claim 11 wherein said signal processing path further comprises:
   a first lowpass filter coupled between an output of said first programmable gain amplifier and an input of said second programmable gain amplifier.

15. The signal processor of claim 14 wherein said signal processing path further comprises:
   a second lowpass filter coupled between an output of said second programmable gain amplifier and an output of said signal processing path.

16. The signal processor of claim 15 wherein said signal processing path further comprises:
   an analog-to-digital converter coupled between an output of said second lowpass filter and said output of said signal processing path.

17. A method for processing a signal comprising:
   amplifying an input signal using a first programmable gain amplifier;
   subsequently amplifying an output of said first programmable gain amplifier using a second programmable gain amplifier;
   measuring offsets in said first and second programmable gain amplifiers during calibration;
   correcting a measured offset of said first programmable gain amplifier by adding a first offset to an input of said first programmable gain amplifier; and
   correcting a measured offset of said second programmable gain amplifier by adding a second offset to an input of said second programmable gain amplifier.

18. The method of claim 17 further comprising:
   setting a gain of said first programmable gain amplifier using first and second variable resistors; and
   varying said first offset in response to both an offset voltage of said first programmable gain amplifier and to values of said first and second variable resistors.

19. The method of claim 17 further comprising:
   determining said offsets of said first and second programmable gain amplifiers and a final offset by measuring outputs of said first and second programmable gain amplifiers and an overall output for three different gain combinations of said first and second programmable gain amplifiers.

20. The method of claim 19 further comprising:
   determining said first and second offsets and said final offset further by evaluating three equations in three variables using algebraic substitution.

* * * * *